United States Patent
Arcidiacono et al.

(10) Patent No.: US 11,115,013 B2
(45) Date of Patent: Sep. 7, 2021

(54) CIRCUIT ARRANGEMENT WITH CLOCK SHARING, AND CORRESPONDING METHOD

(71) Applicant: STMicroelectronics S.r.l., Agrate Brianza (IT)

(72) Inventors: Liliana Arcidiacono, Tremestieri Etneo (IT); Santi Carlo Adamo, Aci Castello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/035,074

(22) Filed: Sep. 28, 2020

(65) Prior Publication Data
US 2021/0111712 A1    Apr. 15, 2021

(30) Foreign Application Priority Data
Oct. 11, 2019   (IT) .......................... 102019000018587

(51) Int. Cl.
*H03K 5/00*   (2006.01)
*H03K 5/15*   (2006.01)

(52) U.S. Cl.
CPC ............................... *H03K 5/15093* (2013.01)

(58) Field of Classification Search
CPC ............................................... H03K 5/15093
USPC ....................................................... 327/176
See application file for complete search history.

(56) References Cited

U.S. PATENT DOCUMENTS

| | | | |
|---|---|---|---|
| 5,732,241 A * | 3/1998 | Chan .................... | G06F 12/0802 711/131 |
| 6,122,696 A * | 9/2000 | Brown ................. | G06F 13/4018 710/307 |
| 2007/0177613 A1 | 8/2007 | Shorty et al. | |
| 2008/0158933 A1* | 7/2008 | Allen ...................... | G11C 17/18 365/96 |
| 2012/0102345 A1 | 4/2012 | Park et al. | |
| 2013/0191665 A1* | 7/2013 | Mehta ................... | G06F 1/3275 713/322 |

* cited by examiner

*Primary Examiner* — Ryan Jager
(74) *Attorney, Agent, or Firm* — Slater Matsil, LLP

(57) ABSTRACT

In an embodiment, a system includes a slave circuit configured to receive an external clock signal from a master circuit, the slave circuit comprising first and second peripherals configured to receive respective clock signals obtained from the external clock signal, wherein the master circuit is configured to send to the slave circuit the external clock signal according to two different timing modes, wherein the slave circuit comprises a logic circuit configured to provide a locking signal to the first peripheral circuit when the logic circuit detects a given operating mode of the slave circuit, wherein the master circuit is configured to send the external clock signal according to a first timing mode before receipt of the locking signal, and wherein the master circuit is configured, following upon receipt of the locking signal, to send the external clock signal according to a second timing mode different from the first timing mode.

21 Claims, 6 Drawing Sheets

CIRCUIT ARRANGEMENT WITH CLOCK SHARING, AND CORRESPONDING METHOD

CROSS-REFERENCE TO RELATED APPLICATIONS

This application claims the benefit of Italian Patent Application No. 102019000018587, filed on Oct. 11, 2019, which application is hereby incorporated herein by reference.

TECHNICAL FIELD

The present disclosure relates generally to an electronic system and method, and, in particular embodiments, to a circuit arrangement with clock sharing, and corresponding method.

BACKGROUND

Known electronic systems may include a circuit arrangement that includes a microprocessor operating as master device, and at least one slave circuit (e.g., a slave device) comprising a plurality of peripheral circuits (also referred to as peripherals). The plurality of peripherals may require the use of respective clock signals, or clocks. The slave circuit may obtain the respective clock signals by deriving them from an external clock signal supplied by the microprocessor to an input of the slave circuit. The peripherals can hence find themselves sharing a continuous reference clock for their timings. For example, a clock may be formed by a sequence of pulses sent continuously or in any case for a time interval longer than the time interval during which the microprocessor uses the peripheral (e.g., preferably at a constant nominal frequency), so that the data are exchanged at a rate based upon the peripheral that requires the slowest clock for its operation.

In some implementations, however, communication between the microprocessor and a particular peripheral does not occur continuously, but requires generation of the clock signal only at the moment when the microprocessor wishes to communicate with the peripheral in question.

SUMMARY

In the absence of a specific mechanism of selection of the peripherals (e.g., for example a chip-select mechanism that enables selection of the peripheral), when the clock signal is generated continuously for another type of communication or for a particular operating mode of the circuit arrangement, it may not be possible to inhibit the aforesaid peripheral, which otherwise could find itself in an indefinite state or execute undesired operations when it does not have to communicate with the microprocessor but the microprocessor has to execute operations on other peripherals internal to the slave circuit or device. Moreover, it may not be possible for the microprocessor to change the mode of generation of the clock, when, instead, the peripheral is active.

Some embodiments provide more efficient electronic converters.

Various embodiments relate to a circuit arrangement. In various embodiments, the circuit arrangement comprises a slave circuit, e.g., an integrated circuit, which receives an external clock signal from a master circuit, e.g., a microprocessor, the slave circuit comprising a plurality of peripherals that receive a respective clock signal obtained from the external clock signal, the master circuit being configured for sending the external clock signal according to at least two different timing modes for respective peripherals in the plurality of peripherals.

In some embodiments, the slave circuit comprises a logic circuit configured for generating at least one locking signal for at least one peripheral of said plurality of peripherals, the locking signal also being supplied to the master circuit through an output of the slave circuit, the logic circuit being configured for generating the locking signal when it detects a given operating mode of the slave circuit.

In some embodiments, the master circuit is configured for sending, after receipt of the locking signal, the external clock signal according to a given (e.g., different) timing mode.

In various embodiments, the circuit arrangement is configured for programming a value representing the given operating mode in a register of the slave circuit, e.g., a register interfaced via the serial interface, and detecting the given operating mode by reading the value representing the given operating mode in the programmed register.

In various embodiments, the circuit arrangement is configured for subsequently erasing the locking signal and sending the clock signal in a different timing mode.

In various embodiments, the master circuit is a microprocessor and the at least one peripheral of the plurality of peripherals is a serial interface configured for accessing a register bank.

In some embodiments, the logic circuit is configured for detecting an operating mode of the slave circuit by verifying whether an operation of access to a further peripheral in the plurality of peripherals represented by a non-volatile memory is required. In the affirmative case, the circuit arrangement is configured to send the locking signal that inhibits operation of the serial interface, where the microprocessor is configured for sending an external clock signal in continuous timing mode, and where the circuit arrangement is configured for erasing the locking signal and sending the clock signal in timing mode for driving the serial interface for the transmission of data.

In various embodiments, the logic circuit is configured for executing the erase operation by detecting an end of the request for the operation of access to the non-volatile memory.

In various embodiments, the microprocessor is configured for executing the erase operation by supplying an unlocking sequence to the serial interface, which determines writing in a dedicated unlocking register comprised in the bank of the internal registers of an unlocking value that generates an unlocking signal supplied by the register at input to the logic circuit, which, after receipt of the unlocking signal, is configured for deactivating the locking signal.

In various embodiments, after execution of the erase operation, the circuit arrangement is configured for deactivating the unlocking signal by erasing the contents of the dedicated unlocking register.

In various embodiments, the serial interface comprises a shift register for transmission of serial data, and the serial interface is configured for the locking operation of the shift register after receipt of the locking signal.

In various embodiments, the given operating mode requests receipt of the external clock signal is configured with a timing mode different from the timing mode used by the at least one peripheral.

Moreover, in the present description, various embodiments regard a method for controlling a circuit arrangement that comprises a slave circuit, which receives an external clock signal from a master circuit according to any one of the previous embodiments, the method comprising:

receiving by the plurality of peripherals a respective clock signal obtained from the external clock signal, and sending the external clock signal according to at least two different timing modes for respective peripherals in said plurality of peripherals, the method further comprising:

generating at least one locking signal for at least one peripheral of the plurality of peripherals, the locking signal also being supplied to the master circuit through an output of the slave circuit, generating the locking signal when an operating mode of the slave circuit is detected that requests receipt of the external clock signal according to a timing mode different from the timing mode used by the at least one peripheral, and after receipt of the locking signal, sending the external clock signal according to the different timing mode.

BRIEF DESCRIPTION OF THE DRAWINGS

The embodiments of the present disclosure will now be described with reference to the annexed drawings, which are provided purely by a way of non-limiting example and in which.

DETAILED DESCRIPTION OF ILLUSTRATIVE EMBODIMENTS

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of this description is intended to indicate that a particular configuration, structure, or characteristic described in relation to the embodiment is comprised in at least one embodiment. Hence, phrases such as "in an embodiment," "in one embodiment," and the like that may be present in various points of this description do not necessarily refer to one and the same embodiment. Moreover, particular conformations, structures, or characteristics may be combined in an adequate way in one or more embodiments.

The references used herein are provided only for convenience and hence do not define the sphere of protection or the scope of the embodiments.

Some embodiments relate to a circuit arrangement and a corresponding method for controlling the circuit arrangement that operate to guarantee proper communication between a microprocessor and a plurality of peripherals of a slave circuit comprised in the circuit arrangement, such as in the case where peripherals of the plurality of peripherals share a single source of clock signal, which, however, must be generated with different timings.

Figure 1:
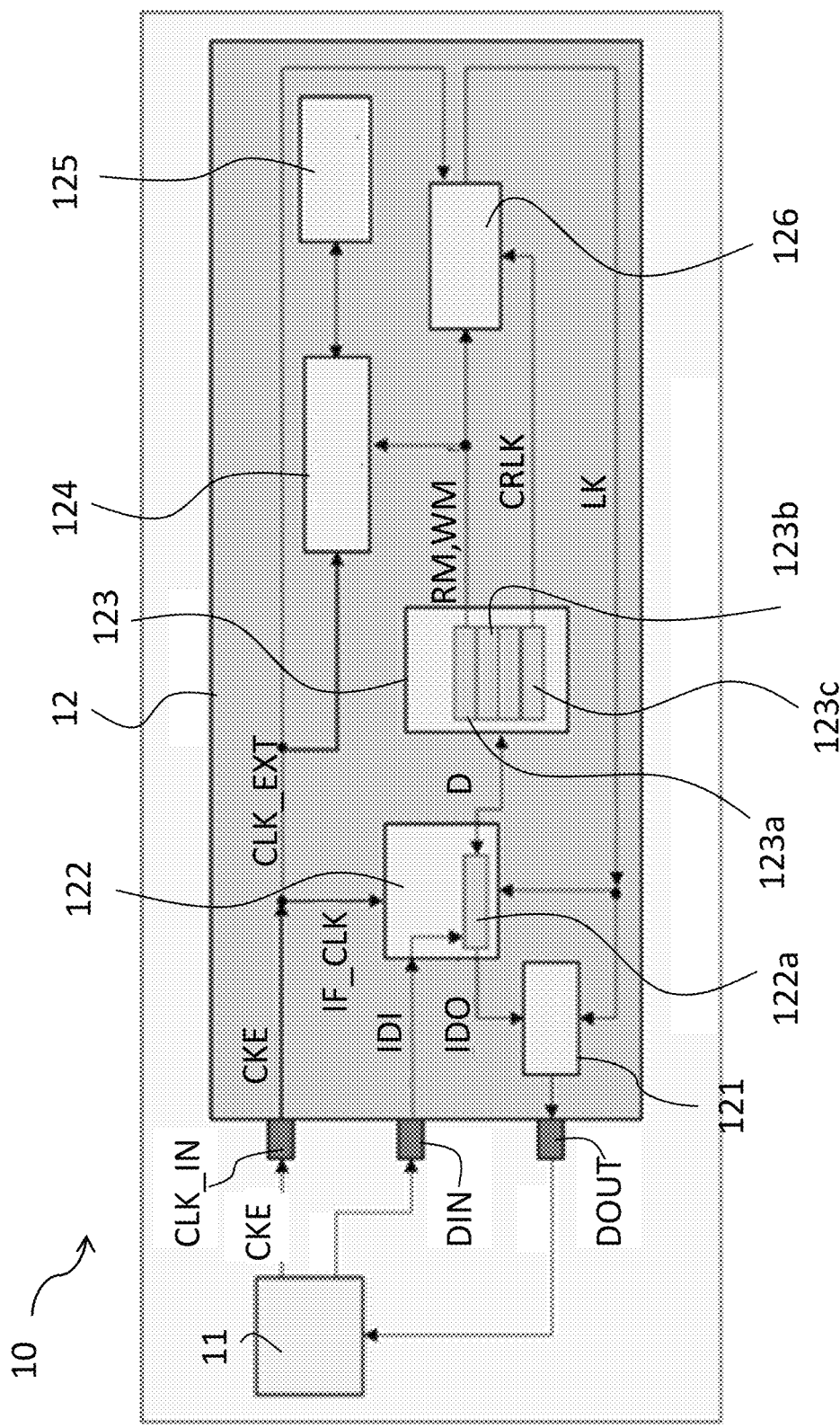
FIG. 1 is a schematic illustration of a circuit arrangement according to the present description.

FIG. 1 is hence a schematic illustration of a circuit arrangement, designated by the reference number 10, which comprises a microprocessor 11 and a slave circuit 12 (e.g., where slave circuit 12 is implemented as an integrated circuit). In the example specifically shown, slave circuit 12 is a buck controller of a synchronous type, where the buck controller controls a buck (step-down) switching power converter. The buck controller 12 includes a plurality of peripherals including a serial communication peripheral, or serial interface 122, and a non-volatile-memory interface 124 for accessing a non-volatile memory 125. The microprocessor 11 supplies an external clock signal CKE on a single input-clock pad CLK_IN of the slave circuit 12. It may be noted that, since the slave circuit 12 implements within the circuit arrangement 10 the solution described herein for managing the plurality of peripherals, some embodiments preferably do not include, for selection of each peripheral in the slave circuit 12, any mechanism of chip select, device-address matching, and communication start/stop or acknowledge, the aim being to reduce the number of its own pins.

In some embodiments, the application of the continuous clock signal CLK_EXT must occur without affecting proper operation of the serial interface 122. In some embodiments, the serial interface 122 must not function simultaneously with the non-volatile-memory interface 124, and data transfer occurs on the basis of a clock slot IF_CLK.

FIG. 1 illustrates only the peripherals 122 and 124/125, but some embodiments, such as described hereinafter, enable the microprocessor 11 to communicate with possible peripherals internal to the slave circuit 12 and that require clock sources with different timings, which are, however, supplied starting from a clock signal received on a single pad, for example the input-clock pad CLK_IN.

In the circuit arrangement 10 described in FIG. 1, the slave circuit 12 further comprises an input-data pad DIN and an output-data pad DOUT. Communication of the serial interface 122 with the microprocessor 11 envisages the use of interface input-data and output-data buses IDI and IDO, coupled for supplying the respective signals, designated by the same references, respectively at input on the input-data pad DIN and at output on the output-data pad DOUT, and an interface clock signal IF_CLK, which is derived from the external clock signal CKE on the present single input-clock pad CLK_IN for access in reading/writing to a bank of internal registers 123, comprised in the slave circuit 12. The bank of internal registers 123 comprises a plurality of registers for storing data D, and designated by 123b is a register in the plurality of registers. The register bank 123 further comprises a specific command-storage register 123a and an unlocking register 123c. The serial interface 122 is hence configured for exchanging serial data D, received on the interface input bus IDI, with the bank of internal registers 123; e.g., it is configured for reading and writing serial data D in the internal registers 123.

Figure 2:
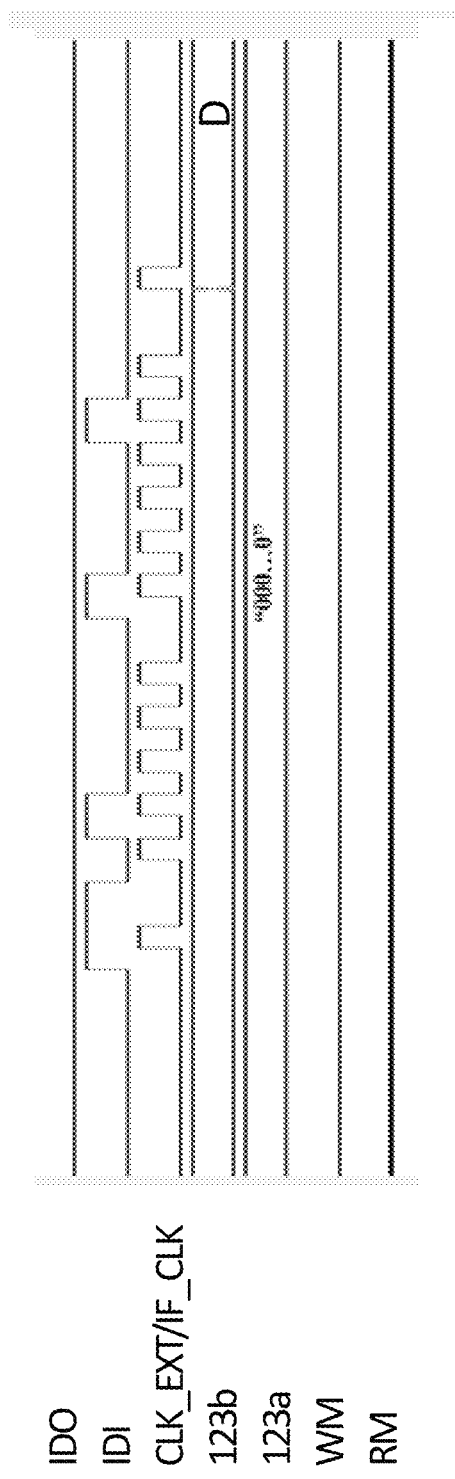
FIG. 2 shows a first timing chart of signals used by an embodiment of a circuit arrangement according to the present description.

The microprocessor 11, which operates as master in the framework of a master/slave communication protocol, manages communication with the serial interface 122, supplying to it from outside the interface clock IF_CLK, which is derived directly from the external clock CKE when it requests access in reading or writing to the internal registers 123, and removing the input clock IF_CLK when access to the internal registers 123 is concluded. In this regard, FIG. 2 shows an example of writing in the register 123b, which represents a generic data-storage register of the register bank 123. FIG. 2 illustrates, in particular, graphs as a function of time t of logic signals of the circuit arrangement 10.

In FIG. 2, IDI and IDO denote the signals at input to and output from the corresponding interface input and output-data buses.

Denoted by CKE is the external clock signal present on the single input-clock pad CLK_IN supplied to the non-volatile-memory interface 124 for accessing the non-volatile memory 125. From the above external clock signal CKE the interface clock IF_CLK is derived; consequently, the two signals CLK_EXT and IF_CLK coincide and are represented by the same timing chart in FIG. 2.

FIG. 2 moreover represents the timing chart of the logic value stored in the register 123b, taken as example of an internal register of the bank 123 in which a value of the datum D is stored.

Hence, the diagram of FIG. 2 moreover represents the timing chart of the value stored in the command-storage register 123a, comprised in the internal-register bank 123, where a value is stored that represents a command for access to the non-volatile memory 125, for example a read or write command. At output from this register, according to its contents, a value is thus present, and hence a signal as a function of time, that represents a memory-write signal WM and a memory-read signal RM, which are supplied to the non-volatile-memory interface 124, which is configured for establishing its own access mode according to the values of the above signals RM, WM. Illustrated in FIG. 2 is an operation of writing in the register 123b via the serial interface 122. The only active signals are the data signal on the interface input bus IDI, which operates under the control of the interface clock IF_CLK by writing the data D in the register 123b. In this case, since the clock signal is sent to the interface 122 for its operation, the memory-write signal WM and memory-read signal RM for access to the memory 125 are not necessary and are inactive; in the example they are at a low logic level.

Figure 3:
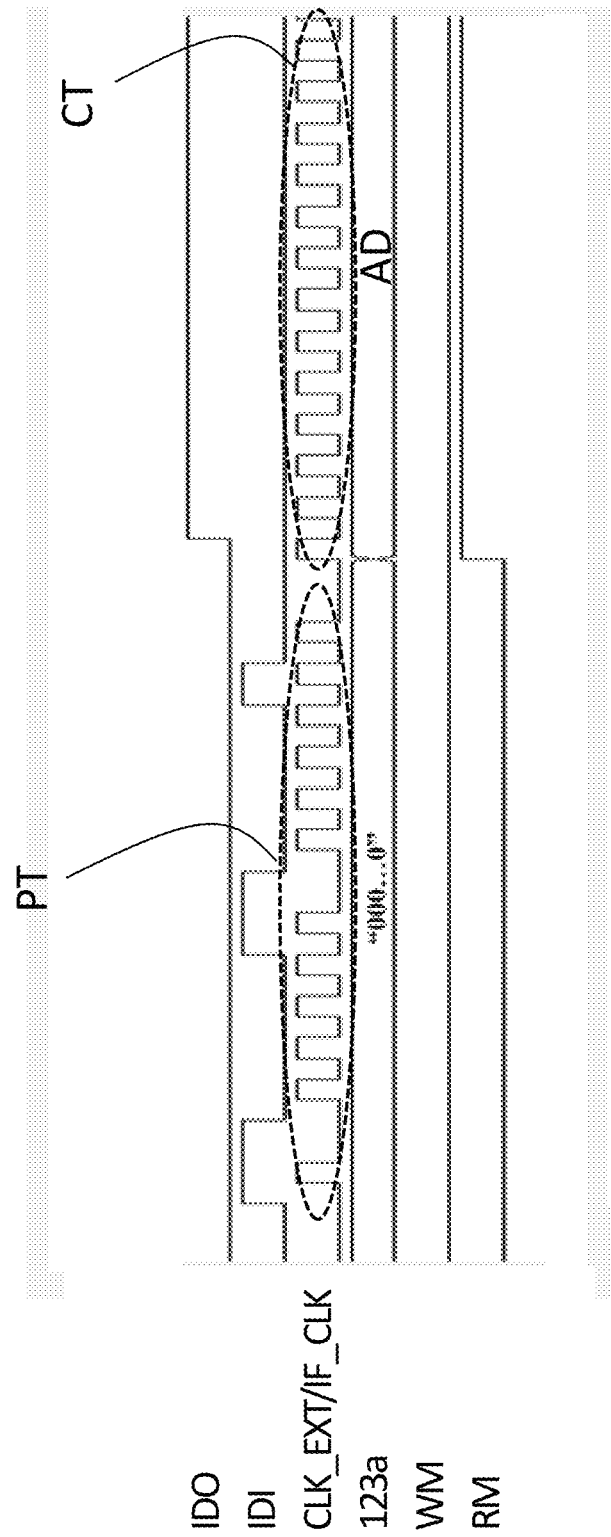
FIG. 3 shows a second timing chart of signals used by an embodiment of a circuit arrangement according to the present description.

The non-volatile-memory interface 124, instead, on the basis of the continuous clock CLK_EXT supplied on the same pad CLK_IN as that of the interface clock IF_CLK manages access in reading/writing to a non-volatile memory 125, as illustrated in FIG. 3.

In this case, the microprocessor 11, via the serial interface 122, sends a pre-set number of interface clock pulses IF_CLK, i.e., a slot or time interval PT of a given length of pulses, which are designed to program, on the dedicated internal register, i.e., the command-storage register 123a, the type of access operation to be made on the non-volatile memory 125, i.e., write or read access, indicated by the access datum or value A, on the basis of which either the signal WM or the signal RM is asserted.

FIG. 3 shows that in the command-storage register 123a, initialized for example with logic zeroes, is loaded, at a given instant, with the above access datum A, indicating the type of access to be made to the memory, whereas, prior to this instant, logic zeroes are present in the command-storage register 123a.

Once the operation has been programmed, the continuous clock CLK_EXT is supplied on the input-clock pad CLK_IN, in the continuous mode CT, to the non-volatile-memory interface 124 that manages the read or write operation required on the non-volatile memory 125.

During operation of the non-volatile memory 125, the serial interface 122 is active, and at each pulse of the continuous clock CLK_EXT, continues to read and decode the information that is present on the interface input-data bus IDI, it thus possible for it to change state in an uncontrolled and undesired way.

For this reason, some embodiments block sampling of the data at the input to the serial interface 122 when communication with the non-volatile-memory interface 124 and consequent access to the non-volatile memory 125 is in progress.

In some embodiments, in order to solve the problem of clock sharing, when the serial interface 122 does not need to be active, a locking signal LK is generated by a first logic circuit 126. In particular, this locking signal LK locks the shift register 122a internal to the serial interface 122 and is generated when an operation of reading or writing of the non-volatile memory 125 has been programmed on the internal registers 123, or also during a particular operating mode of the device, for example a testing mode, which may require a continuous clock from outside and does not envisage activity of the serial peripheral 122.

Figure 4:
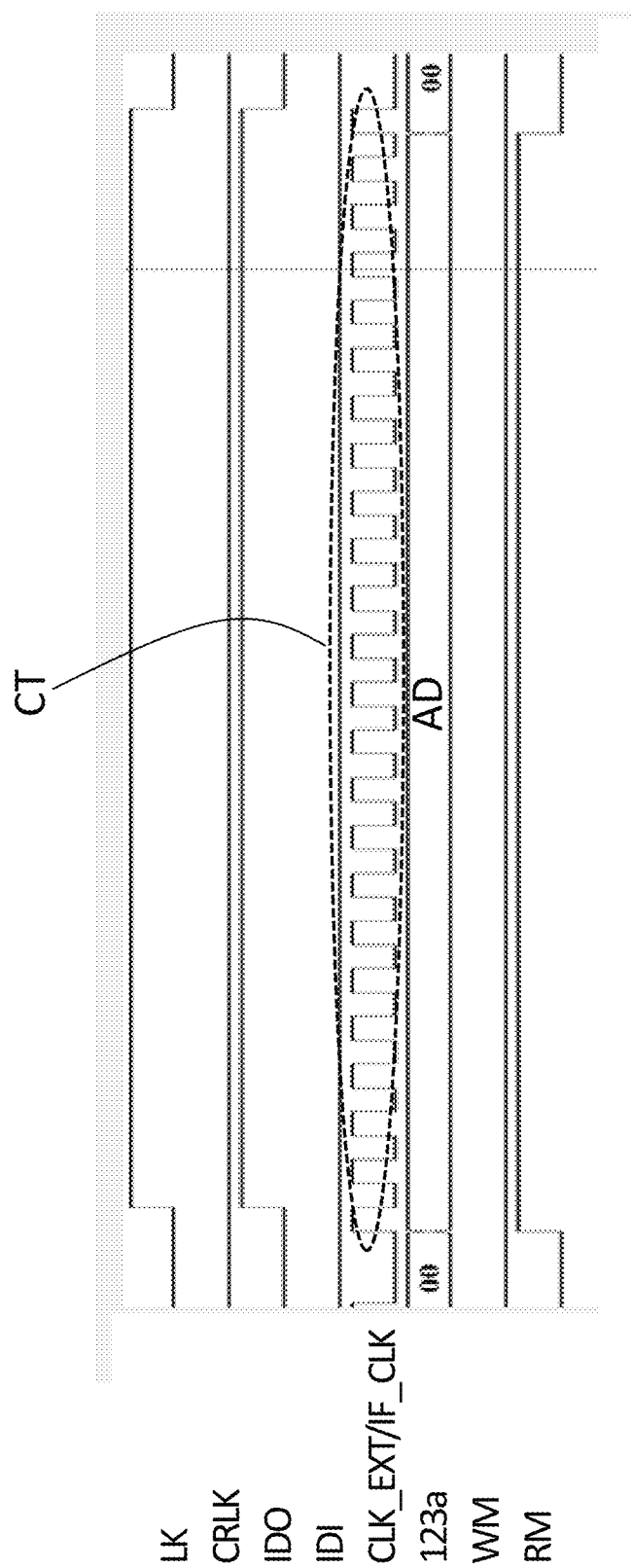
FIG. 4 shows a third timing chart of signals used by an embodiment of a circuit arrangement according to the present description.

In FIG. 1 and with reference to the timing chart of FIG. 4, a logic locking signal LK is hence represented, which is generated by a locking logic control circuit 126 and is supplied to the serial interface 122, which is configured, following upon receipt of this locking signal LK set at a given logic state, in the example a high logic state, for blocking transmission of the serial data D, in particular by blocking storage in the shift register 122a.

More precisely, the data D are the data that are stored in the internal registers 123 as a consequence of a transmission of serial data on the interface input-data bus IDI with interface clock IF_CLK, as shown in FIG. 2.

The high locking signal LK does not block transmission of the serial data on the interface input-data bus IDI, but locks the shift register 122a internal to the serial interface 122, for example, as a consequence of:
- a particular operating mode of the device that requires a continuous clock; or
- the data A, represented in FIG. 4, written in a dedicated register, for example the command-storage register 123a, for executing the operations of access WM/RD to the non-volatile memory 125.

In this way, the serial interface 122 does not evolve in an undesired way when the microprocessor 11 sends the external clock CKE continuously (in continuous mode CT), which is necessary for, e.g., accessing the non-volatile memory 125 or executing a testing mode. In some embodiments, the interface input-data line IDI is simultaneously kept at a low level during the continuous mode CT.

The locking signal LK is also supplied to a second logic control circuit 121, which sends it, through its output data pad DOUT, to the microprocessor 11. When the microprocessor 11 receives the locking signal LK at a given logic state, in the example a high logic state, which indicates the state of locking of the interface 122, it is configured for sending the external clock signal CKE according to a continuous-clock mode to the slave circuit 12, for execution of the required operating mode, specifically for accessing the non-volatile memory 125.

Moreover shown in FIG. 1 (and FIG. 4) is an unlocking logic signal CRLK, which is generated by the contents of a specific unlocking register 123c of the register bank 123, in particular a register for unlocking the shift register 122a, and is supplied to the first locking logic control circuit 126, for resetting the locking signal LK at a logic state, in the example a low logic state, in which that given transmission of the serial data is no longer blocked; i.e., it is enabled.

Hence, the locking signal LK, through a second logic circuit 121, is generated at output on an output pad DOUT of the slave circuit 12, so that the microprocessor 11 is informed that the serial peripheral, e.g., the serial interface 122, has been locked. It should be noted that the first logic circuit 126 and the second logic circuit 121 may form part of one and the same single logic circuit internal to the slave circuit 12.

Hence, in some embodiments, the microprocessor 11, following upon receipt of the locking signal LK, is configured for sending at the input to the slave circuit 12 on the pad CLK_IN, the external clock CKE as continuous clock CLK_EXT, in continuous mode CT, necessary for communicating with the non-volatile-memory interface 124 or for executing the required operating mode, for example the testing mode, without causing undesired operation of the serial peripheral 122.

In the case where the microprocessor 11 needs to access the serial interface 122 once again (e.g., after being in the continuous mode CT), for example for writing data in the register bank 123, it is necessary for the internal logic, i.e., specifically the first logic circuit 126, to erase the locking signal LK and generate the interface clock signal IF_CLK according to the pattern required by the serial communication.

Figure 5:
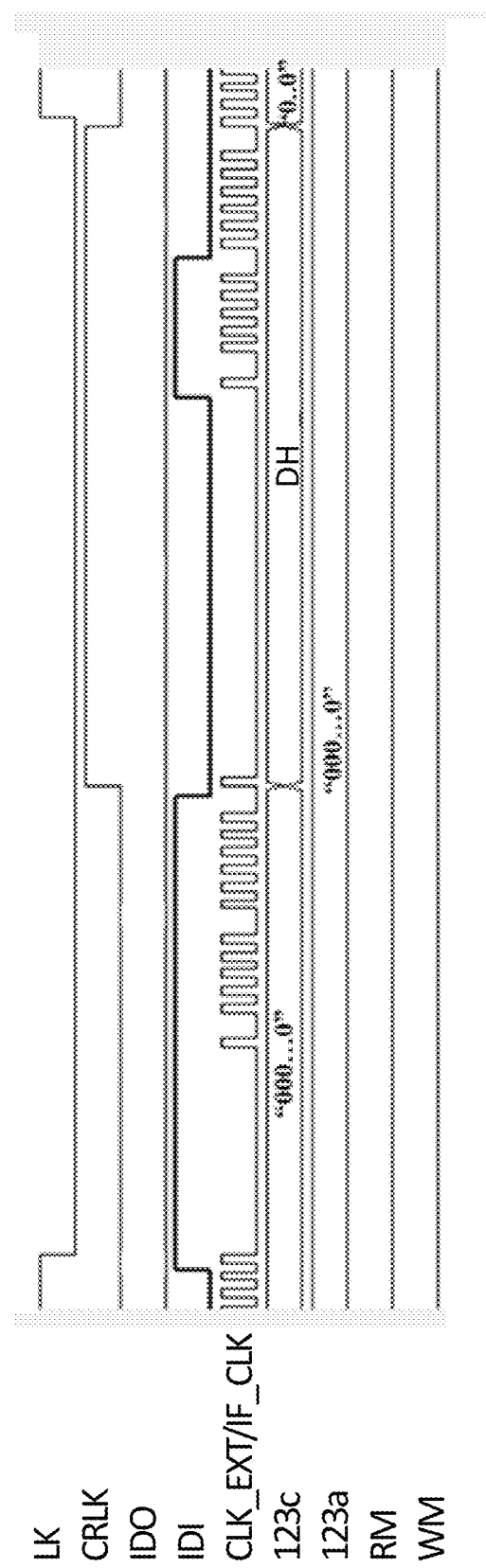
FIG. 5 shows a fourth timing chart of signals used by an embodiment of a circuit arrangement according to the present description.

According to an embodiment, this may occur via two different erasure modes represented in the timing charts of FIG. 4 and FIG. 5.

In a first mode, erasure occurs in an automatic way, when the operations of reading/writing in the internal memory 125 have been completed. In this regard, the first logic circuit 126 receives the signals RM, WM from the interface 124 and determines, based on signals RM and WM, when the operations of reading/writing in the internal memory 125 have been completed.

Hence, FIG. 4 shows a timing chart of signals that represent the signals operating in the circuit device 10 described herein, according to this first mode. Initially, the logic contents of the command-storage register 123a are initialized at a logic value, for example zero or low logic value. When the logic contents of the command-storage register 123a represent a read operation, the corresponding signal RM goes to the high logic level DH, the microprocessor 11 sends the continuous clock signal CLK_EXT, comprising a sequence of reading pulses, and, simultaneously with sending of the external clock signal CKE in continuous mode, the first logic circuit 126 is configured for asserting the locking signal LK, which, going, for example, to a high logic level, inhibits operation of the serial interface 122, in particular that of the shift register 122. The output signal on the output bus IDO goes to the high logic level. When the logic contents DH of the command-storage register 123a are changed, for example they return a sequence of zeroes, the read signal RM returns to the low logic level, and consequently the first logic circuit 126 (which receives the read signal RM), is configured for de-activating the locking signal LK, in particular sending it back to the low logic level, e.g., in response to the read signal RM returning to the low logic level. The serial interface 122 is once again enabled for operation.

It should be noted that the register 123a, which generates the signal RM/WM, is automatically erased when the operation of reading or writing of the memory is completed. The corresponding state information is supplied by the interface 124 that manages the operations of access to the memory and is used as signal of clearing of the aforesaid register.

According to a second erasure mode, the locking signal LK is erased following upon an unlocking sequence supplied by the microprocessor 11 on the interface input-data bus IDI and on the interface clock signal IF_CLK at input to the serial interface 122, which is interpreted as an operation of writing on a dedicated register, thus generating an unlocking signal CRLK.

Following upon generation of the unlocking signal CRLK, the first logic circuit 126 resets the locking signal LK at the low logic level, consequently unlocking the shift register 122a of the interface 122.

In the embodiment described herein, the unlocking sequence illustrated in FIG. 5 is initiated by the microprocessor 11, which, when it wishes to use the serial interface 122 again, sets, for example, at a high logic level the interface input-data bus IDI, at input to the peripheral 122, without, however, generating any clock signal on the interface clock-signal line IF_CLK.

Next, the microprocessor 11, continuing to maintain the interface input-data bus IDI high, sends a sequence of interface clock pulses IF_CLK required for writing the unlocking signal CRLK in a dedicated register 123c of the register bank 123, which contents are represented in FIG. 5. The address of the register 123c is determined by the interface input-data line IDI at a high logic level.

At this point, the shift-register 122a of the serial interface 122 is unlocked via erasure of the locking signal LK.

The microprocessor 11 then removes the continuous clock on the line CLK_EXT and sends the interface clock IF_CLK and the datum on the interface input-data line IDI when it wishes to access another internal register 123 through the serial interface 122.

If the serial interface 122 is to be locked again, the unlocking signal CRLK must be erased by writing the value '0' in the dedicated register 123c.

With reference to the timing modes CT and PT, the operations of communication with the non-volatile-memory interface 124 require application of a continuous clock signal CLK_EXT, e.g., according to a timing mode CT in which a continuous sequence of pulses is sent. The non-volatile-memory interface 124, for example, operates in the presence of the continuous clock CLK_EXT by carrying out in the non-volatile memory 125 the operations programmed in the dedicated registers 123. When the non-volatile-memory interface 124 is to be locked, no action is taken on the continuous clock CLK_EXT, which continues to operate in continuous mode, but the command-storage registers 123a are programmed with a NOP (No OPeration) instruction. When the serial interface 122 towards the registers 123 is not locked (locking signal LK at a low level), at each clock-pulse interface IF_CLK it transfers to the internal shift register 122a the data present on the interface input-data bus IDI. These data encode the various configurations or operating modes of the device, amongst which also the commands for the memory 125.

Hence, from what has been described, it is clear that, in some embodiments, the circuit arrangement 10 comprises a slave circuit 12, which receives an external clock signal CKE from a master circuit 11 (e.g., in the example the microprocessor 11), the slave circuit 12 comprising a plurality of peripherals, which receive a respective clock signal, whether an interface clock signal IF_CLK or a continuous clock signal CLK_EXT, obtained from the external clock signal, where the external clock signal CKE is sent by the master circuit 11 according to at least two different timing modes for respective peripherals in the plurality of peripherals, for example a continuous timing mode CT for enabling access to the memory 125 through the respective interface 124 and a timing mode with pulse slots or patterns PT for controlling the serial interface 122. In particular, some embodiments make it possible to enable/disable a generic peripheral via a respective locking signal that is generated by programming an internal register (for example 123a), which generates a corresponding signal or sets a flag that enables the locking signal.

Figure 6:
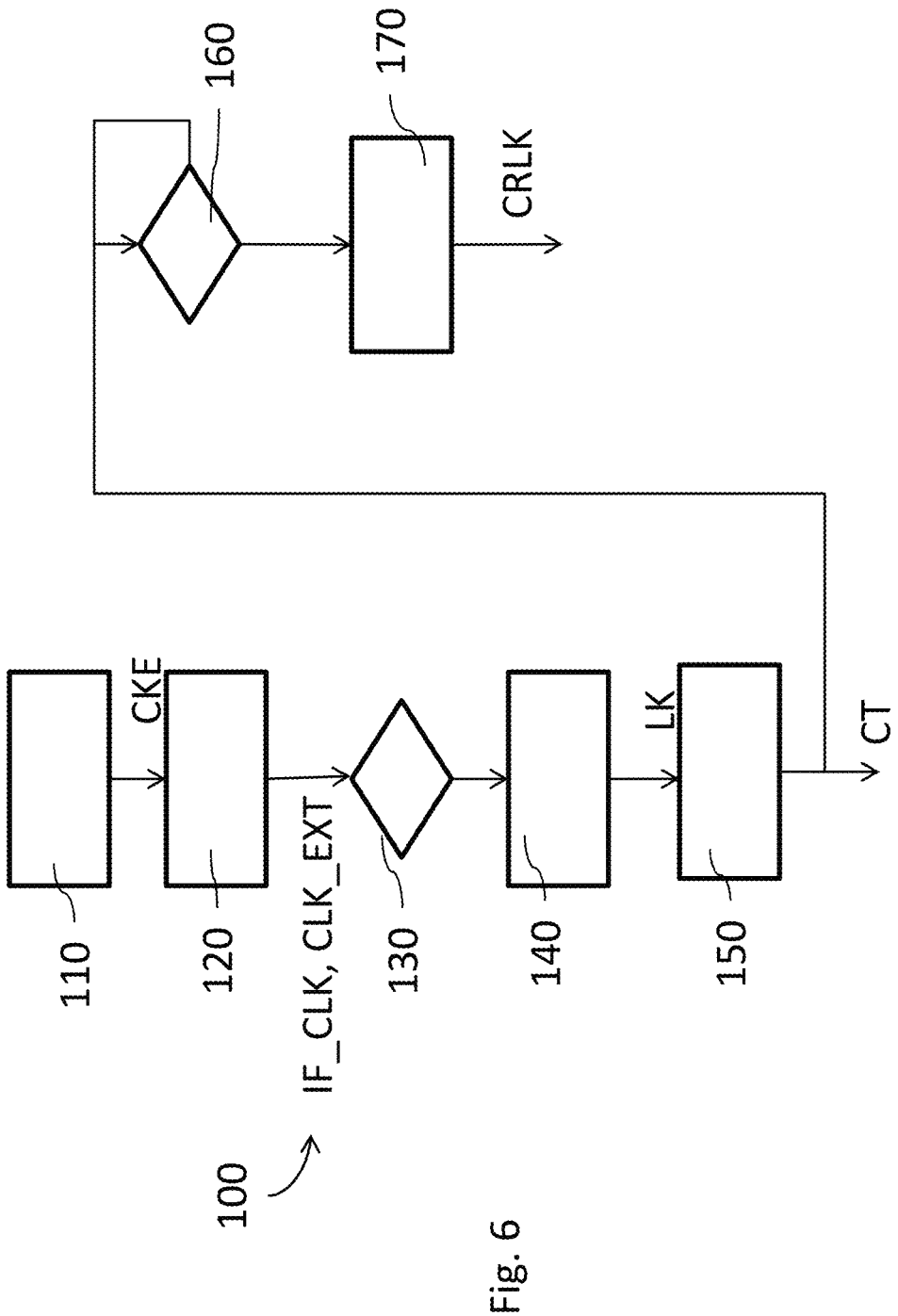
FIG. 6 shows a flowchart representing operations executed by an embodiment of a circuit arrangement according to the present description.

In this context, FIG. 6 shows a flow chart of embodiment method 100 for controlling circuit arrangement 10, according to an embodiment of the present invention. The circuit arrangement 10 is hence configured for:

receiving (step no) by the slave circuit 12, an external clock signal CKE from a master circuit 11, distributing (step 120) to the plurality of peripherals of the slave circuit a respective clock signal IF_CLK, CLK_EXT obtained from the external clock signal CKE. This distribution operation (step 120) comprises sending the external clock signal CKE according to at least two different timing modes, for example the continuous timing mode CT and the pulse-slot timing mode PT, for respective peripherals (in the example the respective serial interface 122 and the respective non-volatile-memory interface 124, in the plurality of peripherals).

According to some embodiments, the circuit arrangement 10 is configured for implementing the operations of:

detecting (step 130) a given operating mode, for example via the access signals RM, WM, of the slave circuit 12, which requests receipt of the external clock signal CKE according to a timing mode, for example a continuous timing mode CT, different from the timing mode, for example the pulse-slot timing mode PT, used by the at least one peripheral for the serial interface 122, and when the operating mode is detected;

generating (step 140) at least one locking signal LK for at least one peripheral (in the example the serial interface 122) from among the plurality of peripherals, the locking signal LK being supplied also to the master circuit 11 through an output DOUT of the slave circuit 12. In particular, the circuit arrangement 10, via the microprocessor 11, is configured for programming a value representing the given operating mode, e.g., RM, WM, in a command-storage register 123a of the slave circuit 12, which is, in particular, interfaced via the serial interface 122, and detecting the given operating mode by reading the value representing the given operating mode in the register programmed, i.e., the command-storage register 123a; and following upon receipt of the locking signal by the master circuit, e.g., the microprocessor 11, sending 150 the external clock signal CKE, in particular by the master circuit or microprocessor, according to the different timing mode, for example the continuous timing mode CT.

FIG. 6 also illustrates an additional erase procedure, which comprises, after step 150, verifying (step 160) whether it is required to use a peripheral with different timing, for example the interface 122, and in the affirmative case, executing a step 170 of erasure of the locking signal LK and sending of the clock signal CKE in the different timing mode. Illustrated in FIG. 6 is the operation of erasure via generation of the unlocking signal CRLK, i.e., the second erasure mode, but step 170 may also be implemented via the first erasure mode, e.g., by detecting an end of the request of operation on the peripheral (e.g., access to the non-volatile memory 125).

Some embodiments advantageously enable (e.g., when the clock signal is generated continuously for another type of communication or for a particular operating mode of the circuit arrangement) inhibition of the aforesaid peripheral (e.g., which otherwise could find itself in an indefinite state or could execute undesired operations when it does not need to communicate with the microprocessor) when the microprocessor intends to execute operations on other peripherals internal to the slave circuit or device. Some embodiments advantageously allow the microprocessor to change the mode of generation of the clock when, instead, the peripheral is active.

Advantageously, some embodiments enable the slave circuit 12 to have a reduced number of pins, it being possible to omit implementation of a mechanism, for example, of chip select, device-address matching, and communication start/stop or acknowledge, for selection of each peripheral in the slave circuit.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A system comprising:
a master circuit; and
a slave circuit configured to receive an external clock signal from the master circuit, the slave circuit comprising first and second peripheral circuits configured to receive respective first and second clock signals obtained from the external clock signal, wherein the master circuit is configured to send to the slave circuit the external clock signal according to two different timing modes for the first and second peripheral circuits, respectively, wherein the slave circuit comprises a logic circuit configured to generate a locking signal and provide the locking signal to the first peripheral circuit, the locking signal being supplied to the master circuit through an output terminal of the slave circuit, wherein the logic circuit is configured to generate the locking signal when the logic circuit detects a given operating mode of the slave circuit, wherein the master circuit is configured to send the external clock signal according to a first timing mode of the two different timing modes before receipt of the locking signal, and wherein the master circuit is configured, following upon receipt of the locking signal, to send the external clock signal according to a second timing mode of the two different timing modes, the second timing mode being different from the first timing mode.

2. The system of claim 1, wherein the system is configured to:
program a value representing the given operating mode in a first register of the slave circuit; and
detect the given operating mode by reading the value representing the given operating mode in the first register.

3. The system of claim 2, wherein the system is configured to, after generating the locking signal, erase the locking signal and send the external clock signal with the first timing mode.

4. The system of claim 3, wherein the master circuit is a microprocessor, wherein the first peripheral circuit is a serial interface configured to access a register bank that comprises the first register, wherein the logic circuit is configured to detect an operating mode of the slave circuit by verifying whether access to the second peripheral circuit is requested, and when access to the second peripheral circuit is requested the logic circuit is configured to send the locking signal to inhibit operation of the serial interface, wherein the second timing mode is a continuous timing mode (CT), and wherein erasing the locking signal enables the serial interface for transmission of data.

5. The system of claim 4, wherein the second peripheral circuit comprises a non-volatile memory.

6. The system of claim 5, wherein the logic circuit is configured to erase the locking signal by detecting an end of the request for access to the non-volatile memory.

7. The system of claim 4, wherein the microprocessor is configured to erase the locking signal by supplying an unlocking sequence to the serial interface to write to a second register of the register bank an unlocking value to generate an unlocking signal supplied to the logic circuit, wherein the logic circuit is configured to deactivate the locking signal in response to receiving the unlocking signal.

8. The system of claim 7, wherein the second register is configured to supply the unlocking signal.

9. The system of claim 7, wherein, after erasing the locking signal, the system is configured to deactivate the unlocking signal by erasing the second register.

10. The system of claim 4, wherein the serial interface comprises a shift register configured to transmit serial data to the register bank, and wherein the serial interface is configured to block operation of the shift register following upon receipt of the locking signal.

11. The system of claim 1, wherein the slave circuit is implemented in an integrated circuit.

12. The system of claim 1, wherein the master circuit is a microprocessor.

13. The system of claim 1, wherein the first and second clock signals are identical.

14. A method comprising:
receiving, by a slave circuit, an external clock signal from a master circuit;
distributing to a plurality of peripheral circuits of the slave circuit a respective clock signal obtained from the external clock signal, wherein distributing the respective clock signal comprises sending the external clock signal according to at least two different timing modes for respective peripheral circuits of the plurality of peripheral circuits, wherein the plurality of peripheral circuits comprises a first peripheral circuit that uses the external clock signal in a first timing mode of the at least two different timing modes, and a second peripheral circuit that uses the external clock signal in a second timing mode of the at least two different timing modes;
detecting a given operating mode of the slave circuit for accessing the second peripheral circuit;
when the given operating mode is detected,
requesting the external clock signal to operate according to the second timing mode by generating a locking signal and supplying the locking signal to the master circuit, and
supplying the locking signal to the first peripheral circuit, wherein the second timing mode is different from the first timing mode; and
following upon receipt of the locking signal, sending, by the master circuit, the external clock signal according to the second timing mode.

15. A circuit comprising:
a clock terminal configured to receive a clock signal;
a further terminal;
a register bank;
a first peripheral circuit having a clock input coupled to the clock terminal;
a second peripheral circuit having a clock input coupled to the clock terminal; and
a logic circuit, wherein the circuit is configured to operate in first and second modes, wherein, in the first mode, the first peripheral circuit is configured to access the register bank based on the clock signal having a first timing mode, and wherein, in the second mode:
the logic circuit is configured to:
activate a locking signal,
provide the locking signal to the first peripheral circuit to prevent the first peripheral circuit from accessing the register bank, and
provide the locking signal at the further terminal to request the clock signal to operate in a second timing mode different from the first timing mode, and
the second peripheral circuit is configured to operate based on the clock signal having the second timing mode.

16. The circuit of claim 15, wherein the first peripheral circuit comprises a shift register, and wherein activating the locking signal blocks operation of the shift register.

17. The circuit of claim 15, further comprising a non-volatile memory, and wherein operating the second peripheral circuit comprises accessing the non-volatile memory.

18. The circuit of claim 17, wherein operating the second peripheral circuit comprises writing into the non-volatile memory.

19. The circuit of claim 15, wherein the logic circuit is to deactivate the locking signal to transition from the second mode to the first mode.

20. The circuit of claim 19, wherein the logic circuit is configured to deactivate the locking signal based on a first register of the register bank.

21. The circuit of claim 15, further comprising a master circuit configured to receive from the further terminal the locking signal and provide to the clock terminal the clock signal with the first timing mode when the locking signal is deactivated, and with the second timing mode when the locking signal is activated.

* * * * *